United States Patent
Li et al.

(10) Patent No.: US 10,484,137 B2
(45) Date of Patent: Nov. 19, 2019

(54) POLAR CODE HYBRID AUTOMATIC REPEAT REQUEST METHOD AND APPARATUS

(71) Applicant: HUAWEI TECHNOLOGIES CO., LTD., Shenzhen, Guangdong (CN)

(72) Inventors: Bin Li, Shenzhen (CN); Hui Shen, Shenzhen (CN); Kai Chen, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 132 days.

(21) Appl. No.: 15/719,832

(22) Filed: Sep. 29, 2017

(65) Prior Publication Data
US 2018/0026751 A1 Jan. 25, 2018

Related U.S. Application Data

(63) Continuation of application No. PCT/CN2015/075727, filed on Apr. 1, 2015.

(51) Int. Cl.
*H03M 13/00* (2006.01)
*H04L 1/08* (2006.01)
(Continued)

(52) U.S. Cl.
CPC .............. *H04L 1/08* (2013.01); *H03M 13/13* (2013.01); *H04L 1/0041* (2013.01); *H04L 1/0057* (2013.01); *H04L 1/1812* (2013.01)

(58) Field of Classification Search
None
See application file for complete search history.

(56) References Cited

U.S. PATENT DOCUMENTS

2010/0088575 A1* 4/2010 Sharon ................ G06F 11/1072
714/763
2011/0307754 A1* 12/2011 Sun ..................... H03M 13/033
714/752
(Continued)

FOREIGN PATENT DOCUMENTS

CN 101064708 A 10/2007
CN 103281166 A 9/2013
(Continued)

OTHER PUBLICATIONS

Shacham et al., "An Adaptive Hybrid ARQ Algorithm for Radio Channels," International Conference on Communication, 1985, XP002081403, pp. 1390-1394.
(Continued)

*Primary Examiner* — Mujtaba M Chaudry
(74) *Attorney, Agent, or Firm* — Staas & Halsey LLP

(57) ABSTRACT

Embodiments of the present invention provide a polar code hybrid automatic repeat request method and an apparatus. The method includes: obtaining, by a communications device, a bit sequence of retransmission information, where the bit sequence of the retransmission information includes K retransmission information bits determined from a bit sequence of first transmission information, the bit sequence of the first transmission information includes N first transmission information bits, N is a positive integer, and K is a positive integer not greater than N; performing, by the communications device, polar code encoding on the bit sequence of the retransmission information, to obtain an encoded retransmission bit sequence; and sending, by the communications device, the encoded retransmission bit sequence to another communications device.

22 Claims, 9 Drawing Sheets

(51) Int. Cl.
*H03M 13/13* (2006.01)
*H04L 1/18* (2006.01)
*H04L 1/00* (2006.01)

(56) References Cited

U.S. PATENT DOCUMENTS

| | | | |
|---|---|---|---|
| 2015/0103947 A1 | 4/2015 | Shen et al. | |
| 2016/0182187 A1* | 6/2016 | Kim | H03M 13/09 714/807 |
| 2016/0285479 A1* | 9/2016 | El-Khamy | H03M 13/6368 |
| 2017/0012744 A1 | 1/2017 | Shen et al. | |

FOREIGN PATENT DOCUMENTS

| | | |
|---|---|---|
| CN | 103516476 A | 1/2014 |
| CN | 106464446 A | 2/2017 |
| EP | 3 113 400 A1 | 1/2017 |
| WO | WO 2009/116754 A2 | 9/2009 |

OTHER PUBLICATIONS

Eslami et al., "A Practical Approach to Polar Codes," 2011 IEEE International Symposium on Information Theory Proceedings, Jul. 2011, XP31971501, pp. 16-20.
Chen et al., "Polar Coded HARQ Scheme with Chase Combining," IEEE Wireless Communications and networking Conference, Apr. 2014, XP32683031, pp. 474-479.
Chen et al., "A Hybrid ARQ Scheme Based on Polar Codes," IEEE Communications Letters, vol. 17, No. 10, Oct. 2013, XP11535616, pp. 1996-1999.
Extended European Search Report dated Mar. 7, 2018, in corresponding European Patent Application No. 15886942.0, 13 pgs.
International Search Report dated Dec. 30, 2015 in corresponding International Patent Application No. PCT/CN2015/075727.

* cited by examiner

300

S301: Obtain a bit sequence of retransmission information, where the bit sequence of the retransmission information is determined according to K retransmission information bits that are determined from a bit sequence of first transmission information, the bit sequence of the first transmission information includes N first transmission information bits, N is a positive integer, and K is a positive integer not greater than N S302: Perform polar code encoding on the bit sequence of the retransmission information, to obtain an encoded retransmission bit sequence S303: Send the encoded retransmission sequence

FIG. 3

$\mathbf{u}_P^*$ | $u_{p_1}$ | $u_{p_2}$ | $u_{p_3}$ | $u_{p_4}$ | ... | $u_{p_{K-1}}$ | $u_{p_K}$ |
— 1 — 2 — ... — K/2 —

$\mathbf{u}_P$ | $u_{p_2}$ | $u_{p_1}$ | $u_{p_4}$ | $u_{p_3}$ | ... | $u_{p_K}$ | $u_{p_{K-1}}$ |
— 1 — 2 — ... — K/2 —

FIG. 4A $\mathbf{u}_P^*$ | $u_{p_1}$ | $u_{p_2}$ | $u_{p_3}$ | $u_{p_4}$ | $u_{p_5}$ | $u_{p_6}$ | ... | $u_{p_{K-2}}$ | $u_{p_{K-1}}$ | $u_{p_K}$ |
— 1 — 2 — ... — K/3 —

$\mathbf{u}_P$ | $u_{p_3}$ | $u_{p_2}$ | $u_{p_1}$ | $u_{p_4}$ | $u_{p_5}$ | $u_{p_6}$ | ... | $u_{p_K}$ | $u_{p_{K-1}}$ | $u_{p_{K-2}}$ |
— 1 — 2 — ... — K/3 —

S301: Obtain a bit sequence of retransmission information, where the bit sequence of the retransmission information is determined according to K retransmission information bits that are determined from a bit sequence of first transmission information, the bit sequence of the first transmission information includes N first transmission information bits, N is a positive integer, and K is a positive integer not greater than N S302: Perform polar encoding on the bit sequence of the retransmission information, to obtain an encoded retransmission bit sequence S303: Send the encoded retransmission bit sequence S804: Obtain a bit sequence of second-time-retransmission information, where the bit sequence of the second-time-retransmission information is determined according to M second-time-retransmission information bits that are determined from the bit sequence of the first transmission information, and M is a positive integer not greater than N S805: Perform polar encoding on the bit sequence of the second-time-retransmission information, to obtain an encoded second-time-retransmission bit sequence S806: Send the encoded second-time-retransmission bit sequence

FIG. 8

POLAR CODE HYBRID AUTOMATIC REPEAT REQUEST METHOD AND APPARATUS

CROSS-REFERENCE TO RELATED APPLICATIONS

This application is a continuation of International Application No. PCT/CN2015/075727, filed on Apr. 1, 2015, the disclosure of which is hereby incorporated by reference in its entirety.

TECHNICAL FIELD

The present disclosure relates to the field of mobile communications technologies, and in particular, to a polar code hybrid automatic repeat request method and an apparatus.

BACKGROUND

In a communications system, data transmission reliability is usually improved by means of channel encoding, to ensure communication quality. Polar code (polar code) is an encoding technology to which increasing attention is paid, where a composite channel is constructed and a feature of an original channel is changed, so that a capacity of the composite channel is more polarized. Because of such a feature, by means of appropriate encoding design, the polar code technology may be suitable to an original channel that is randomly distributed, and good performance may be achieved and a channel capacity may be approached in many different channel implementations. In addition, the polar code technology can greatly reduce complexity of a receiver by means of interference cancellation decoding, facilitating implementation of the receiver.

To improve communication performance, a hybrid automatic repeat request (HARQ) technology may be used. The HARQ is a technology formed toy combining forward error correction coding and automatic repeat request, and can efficiently compensate for bit errors caused by link adaptation, thereby improving a data transmission rate and reducing a data transmission delay.

However, the feature of the polar code technology is different from that of another existing encoding manner. There are apparent differences in transmission quality of input bits and differences in functions of output bits. Therefore, an encoding capability of a polar code cannot be fully used if the existing HARQ technology is used, resulting in poor HARQ performance.

SUMMARY

The present invention discloses a polar code hybrid automatic repeat request method and an apparatus, so as to resolve a problem that an existing hybrid automatic repeal request technology fails to fully use an encoding capability of a polar code.

According to a first aspect, the present invention provides a polar code hybrid automatic repeat request method, including:

obtaining, by a communications device, a bit sequence of retransmission information, where the bit sequence of the retransmission information includes K retransmission information bits determined from a bit sequence of first transmission information, the bit sequence of the first transmission information includes N first transmission information bits, N is a positive integer, and K is a positive integer not greater than N; performing, by the communications device, polar code encoding on the bit sequence of the retransmission information, to obtain an encoded retransmission hit sequence; and sending, by the communications device, the encoded retransmission bit sequence to another communications device.

With reference to the first aspect, in a first possible implementation manner, the K retransmission information bits in the bit sequence of the retransmission information are arranged according to a preset order, and the preset order is the same as an arrangement order of the N bits in the bit sequence of the first transmission information.

With reference to the first aspect, in a second possible implementation manner, the K retransmission information bits in the bit sequence of the retransmission information are arranged according to an order reverse to a preset order, and the preset order is the same as an arrangement order of the N bits in the bit sequence of the first transmission information.

With reference to the first aspect, in a third possible implementation manner, the bit sequence of the retransmission information includes I sequentially arranged groups, where retransmission information bits included in each of the I groups are arranged according to a preset order or arranged according to an order reverse to the preset order, the preset order is the same as an arrangement order of the N bits in the bit sequence of the first transmission information, and I is a positive integer not greater than K.

With reference to any one of the first aspect or the first possible implementation manner of the first aspect to the third possible implementation manner of the first aspect, in a fourth possible implementation manner, the method further includes: receiving a retransmission parameter; and the obtaining a bit sequence of the retransmission information is specifically: obtaining the bit sequence of the retransmission information according to the retransmission parameter.

With reference to the first aspect or the fourth possible implementation manner of the first aspect, in a fifth possible implementation manner, the obtaining a bit sequence of the retransmission information according to the retransmission parameter is specifically: obtaining the bit sequence of the retransmission information according to the retransmission parameter and pre-stored information, where the pre-stored information includes at least one of a rule for determining the retransmission information hits or a rule for arranging the retransmission information bits.

With reference to any one of the first aspect or the first possible implementation manner of the first aspect to the third possible implementation manner of the first aspect, in a sixth possible implementation manner, the obtaining a bit sequence of the retransmission information is specifically: obtaining the bit sequence of the retransmission information according to pre-stored information, where the pre-stored information includes a rule for determining the retransmission information bits and a ride for arranging the retransmission information bits.

With reference to any one of the first aspect or the first possible implementation manner of the first aspect to the sixth possible implementation manner of the first aspect, in a seventh possible implementation manner, the K retransmission information bits are K bits having lowest reliability among the N first transmission information bits.

According to a second aspect, the present invention provides a polar code encoding apparatus, including:

an obtaining circuit, configured to obtain a bit sequence of retransmission information, where the bit sequence of the retransmission information includes K retransmission information bits determined from a bit sequence of first transmission information, the bit sequence of the first transmission information includes N first transmission information bits, N is a positive integer, and K is a positive integer not greater than N; and an encoding circuit, configured to perform polar code encoding on the bit sequence of the retransmission information, that Is obtained by the obtaining circuit, to obtain an encoded retransmission bit sequence.

With reference to the second aspect, in a first possible implementation manner, the K retransmission information bits in the bit sequence of the retransmission information are arranged according to a preset order, and the preset order is the same as an arrangement order of the N bits in the bit sequence of the first transmission information.

With reference to the second aspect, in a second possible implementation manner, the K retransmission information bits in the bit sequence of the retransmission information are arranged according to an order reverse to a preset order, and the preset order is the same as an arrangement order of the N bits in the bit sequence of the first transmission information.

With reference to the second aspect, in a third possible implementation manner, the bit sequence of the retransmission information includes I sequentially arranged groups, where retransmission information bits included in each of the I groups are arranged according to a preset order or arranged according to an order reverse to the preset order, the preset order is the same as an arrangement order of the N bits in the bit sequence of the first transmission information, and I is a positive integer not greater than K.

With reference to any one of the second aspect or the first possible implementation manner of the second aspect to the third possible implementation manner of the second aspect, in a fourth possible implementation manner, the K retransmission information bits are K bits having lowest reliability among the N first transmission Information bits.

With reference to any one of the second aspect or the first possible implementation manner of the second aspect to the fourth possible implementation manner of the second aspect, in a fifth possible implementation manner, the obtaining circuit is further configured to: obtain the bit sequence of the retransmission information according to pre-stored information, where the pre-stored information includes a rule for determining the retransmission information bits and a rule for arranging the retransmission information bits.

According to a third aspect, the present invention provides a communications apparatus, including:

a receiving circuit, configured to receive a retransmission parameter; and the polar code encoding apparatus according to any one of the second aspect or the first possible implementation manner of the second aspect to the fifth possible implementation manner of the second aspect where the obtaining circuit is further configured to obtain the bit sequence of the retransmission information according to the retransmission parameter received by the receiving circuit.

With reference to the third aspect, in a first possible implementation manner, the obtaining circuit is further configured to: obtain the bit sequence of the retransmission information according to the retransmission parameter and pre-stored information, where the pre-stored information includes at least one of a rule for determining the retransmission information bits or a rule for arranging the retransmission information bits.

According to a fourth aspect, a communications apparatus is provided, where the apparatus includes:

the polar code encoding apparatus according to any one of the second aspect or the first possible implementation manner of the second aspect to the fifth possible implementation manner of the second aspect; the communications apparatus according to the third aspect or the first possible implementation manner of the third aspect; and a transmitting circuit, configured to send the encoded retransmission bit sequence to another communications apparatus.

Based on the foregoing technical solutions, the polar code hybrid automatic repeat request method and the apparatus that are provided in the embodiments of the present invention can fully use an encoding capability of a polar code, thereby achieving hybrid automatic repeat request performance.

BRIEF DESCRIPTION OF DRAWINGS

To describe the technical solutions to the embodiments of the present invention more clearly, the following briefly introduces the accompanying drawings required for describing the embodiments. Apparently, the accompanying drawings in the following description show some embodiments of the present invention, and a person of ordinary skill in the art may still derive other drawings from these accompanying drawings without creative efforts.

FIG. 3 is a flowchart of a polar code hybrid automatic repeat request method according to an embodiment of the present invention;

FIG. 4A is a schematic diagram of a bit sequence of retransmission information according to an embodiment of the present invention;

FIG. 4B is a schematic diagram of another bit sequence of retransmission information according to an embodiment of the present invention;

FIG. 8 is a flowchart of another polar code hybrid automatic repeat request method according to an embodiment of the present invention;

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the an based on the embodiments of the present invention without creative efforts shall fall within the protection scope of the present invention.

The technical solutions of the present invention may be applied to various communications systems, for example, a Global System for Mobile Communications (GSM), a general packet radio service (GPRS) system, a Code Division Multiple Access (CDMA) system, a Wideband Code Division Multiple Access (WCDMA) system, a Long Term Evolution (LTE) system, and various wireless communications systems evolved and developed subsequently, which include but are not limited to the fifth-generation mobile communications system (5G) and the like.

User equipment (HE), also referred to as a mobile terminal, mobile user equipment, or the lite, may communicate with one or more core networks (CN) through a radio access network (RAN). The user equipment may be, for example, a mobile phone or a computer with a mobile terminal. For example, the user equipment may be a portable, pocket-sized, handheld, computer built-in, or in-vehicle mobile apparatus.

A base station may be a base station (BTS) in the GSM or CDMA, may be a base station (NodeB) in the WCDMA, or may be an evolved NodeB (eNB or e-NodeB) in the LTE, or a network device implementing a similar function in a subsequent evolved system, which is not limited in the present invention. It should be noted that changing a form of a network device correspondingly according to an actual network deployment need, for example, changing the form of the network device to a distributed base station or the like, shall also fall within the protection scope of the present invention.

A polar code hybrid automatic repeat request (HARQ) method, an apparatus, and a terminal device that are disclosed in the embodiments of the present invention can fully use a capability of a polar code, thereby improving retransmission performance and efficiency of the polar code.

Figure 1:
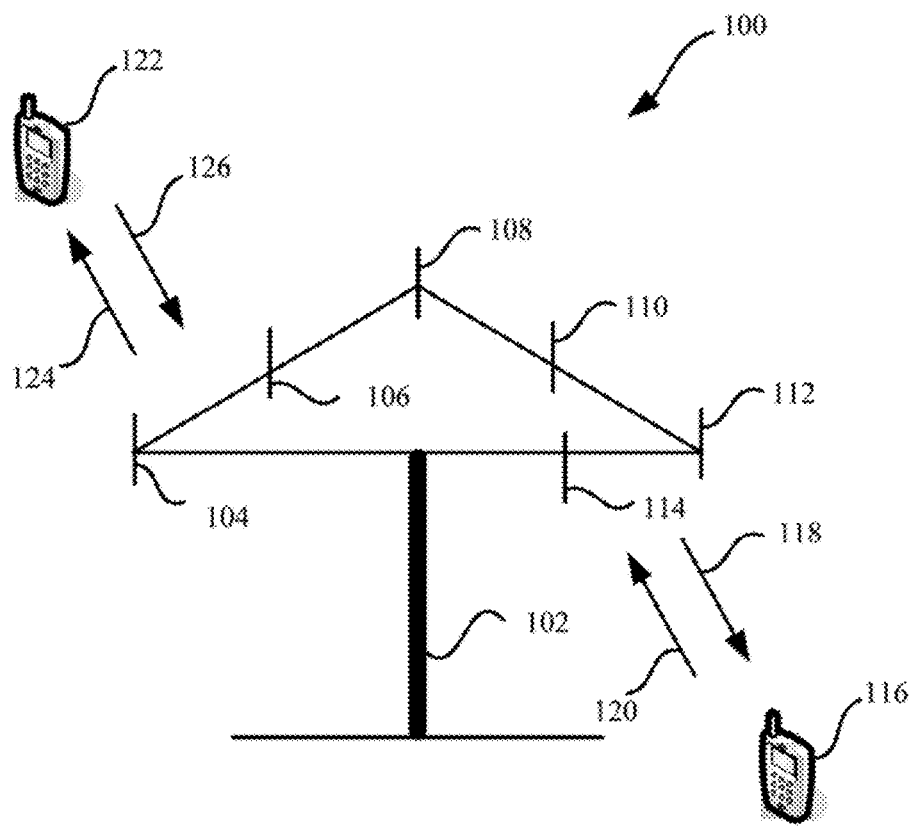
FIG. 1 is a schematic diagram of a wireless communications system according to an embodiment of the present invention.

FIG. 1 shows a wireless communications system 100 according to the embodiments described in the specification. The system 100 includes a base station 102, which may include multiple antenna groups. For example, one antenna group may include an antenna 104 and an antenna 106, another antenna group may include an antenna 108 and an antenna 110, and an additional group may include an antenna 112 and an antenna 114. For each antenna group, two antennas are shown; however, more or fewer antennas may be used for each group. The base station 102 may additionally include a transmitter link and a receiver link, and a person of ordinary skill in the art may understand that both the transmitter link and the receiver link may include multiple components related to signal sending and receiving, for example, a processor, a modulator, a multiplexer, a demodulator, a demultiplexer, and an antenna.

The base station 102 may communicate with one or more access terminals, for example, an access terminal 116 and an access terminal 122. It may be understood that the base station 102 may communicate with any quantity of access terminals that are similar to the access terminal 116 and the access terminal 122. The access terminal 116 and the access terminal 122 may be, for example, a cellular phone, a smart phone, a portable computer, a handheld communications device, a handheld computing device, a satellite radio apparatus, a global positioning system, a PDA, or any other suitable devices configured to perform communication in the wireless communications system 100). As shown in FIG. 1, the access terminal 116 communicates with the antenna 112 and the antenna 114, and the antenna 112 and the antenna 114 send information to the access terminal 116 by using a forward link 118, and receive information from the access terminal 116 by using a reverse link 120. Besides, the access terminal 122 communicates with the antenna 104 and the antenna 106, and the antenna 104 and the antenna 106 send information to the access terminal 122 by using a forward link 124, and receive information from the access terminal 122 by using a reverse link 126. In a frequency division duplex (FDD) system, for example, a frequency band different from that used by the reverse link 120 may be used by the forward link 118, and a frequency band different from that used by the reverse link 126 may be used by the forward link 124. In addition, in a time division duplex (TDD) system, a common frequency band may be used by the forward link 118 and the reverse link 120, and a common frequency band may be used by the forward link 124 and the reverse link 126.

Each antenna group and/or area designed for communication is referred to as a sector of the base station 102. For example, an antenna group may be designed to communicate with an access terminal in a sector of an area covered by the base station 102. In communication by using the forward link 118 and the forward link 124, a transmit antenna of the base station 102 may improve, by means of beam-forming, signal-to-noise ratios of the forward link 118 and the forward link 124 for the access terminal 116 and the access terminal 122. In addition, compared with sending, by the base station by using a single antenna, information to all access terminals of the base station, sending, by the base station 102 by means of beamforming, information to the access terminal 116 and the access terminal 122 that are distributed randomly in a related coverage area causes less interference to a mobile device in a neighboring cell.

In a given period of time, the base station 102, the access terminal 116, or the access terminal 122 may be a sending wireless communications apparatus or a receiving wireless communications apparatus. When sending data, the sending wireless communications apparatus may encode the date for transmission. Specifically, the sending wireless communications apparatus may have a particular quantity of information bits that need to be sent to the receiving wireless communications apparatus by using a channel. Such information bits may be contained in one or more data transport blocks. In addition, the sending wireless communications apparatus may encode each code block by using a polar code encoder, so as to improve data transmission reliability and ensure communication quality.

Figure 2:
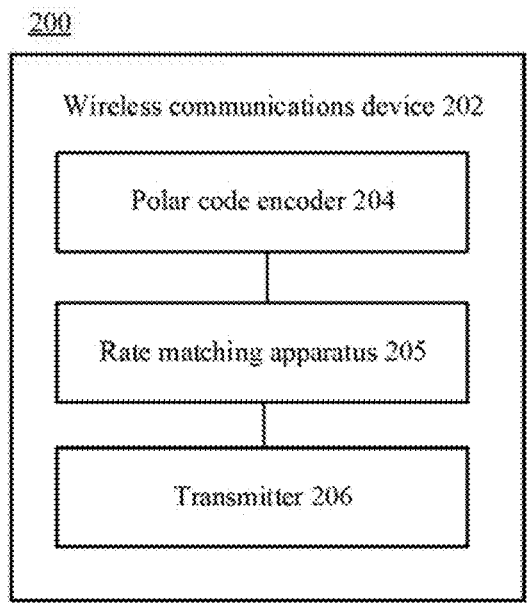
FIG. 2 is a schematic diagram of a polar code encoding system according to an embodiment of the present invention.

FIG. 2 is a schematic block diagram of a system 200 applicable to the present invention in a wireless communication environment and applied to a polar code encoding method. The system 200 includes a wireless communications device 202. The wireless communications device 202 may be a base station, for example, the base station 102 in FIG. 1, or may be an access terminal, for example, the access terminal 116 or the access terminal 122 in FIG. 1.

The wireless communications device 202 further includes a polar code encoder 204, a rate matching apparatus 205, and a transmitter 206. Optionally, the wireless communications device 202 may further include a receiver. The receiver may exist separately, or may be integrated into the transmitter 206 to form a transceiver having sending and receiving functions.

The polar code encoder 204 is configured to encode data to be sent from the wireless communications device 202 to obtain an encoded polar code.

The following describes a specific processing process of the polar code encoder 204 in detail. It should be noted that these embodiments are merely Tor helping a person sidled in the art to better understand the present invention, and not for limiting the protection scope of the present invention.

FIG. 3 is a schematic flowchart of a polar code HARQ method disclosed in the present invention. The method 300 shown in FIG. 3 may be performed by a wireless communications device, for example, the polar code encoder 204 in the wireless communications device shown in FIG. 2.

S301. Obtain a bit sequence of retransmission information, where the bit sequence of the retransmission information is determined according to K retransmission information bits that are determined from a bit sequence of first transmission information, the bit sequence of the first transmission information includes N first transmission information bits, N is a positive integer, and K is a positive integer not greater than N.

S302. Perform polar code encoding on the bit sequence of the retransmission information, to obtain an encoded retransmission bit sequence.

S303. Send the encoded retransmission bit sequence.

It is assumed that the bit sequence of the first transmission information is $u_A=(u_{a_1}, u_{a_2}, \ldots, u_{a_N})$, and a sequence the same as that of the bit sequence of the first transmission information is a preset order. Generally, it is assumed that $a_1<a_2<\ldots<a_N$.

In this embodiment, some bits in the bit sequence $u_A$ of the first transmission information need to be encoded and retransmitted. Specifically, it is assumed that the bit sequence of the retransmission information is $u_P$, and includes K retransmission information bits, that is, $u_{p_1}, u_{p_2}, \ldots, u_{p_K}$, and $1 \leq K \leq N$.

Optionally, in S301, the bit sequence of the retransmission information may be $u_P=(u_{p_1}, u_{p_2}, \ldots, u_{p_K})$, and satisfies $p_1<p_2<\ldots<p_K$, that is, the bit sequence $u_P$ of the retransmission information is determined according to K retransmission information bits that are determined according to a preset order from the bit sequence $u_A$ of the first transmission information. Because a receive end performs decoding by means of joint decoding, in this case, it is relatively simple for the receive end to implement joint decoding during decoding.

Optionally, in S301, the bit sequence of the retransmission information may be $u_P=(u_{p_K}, u_{p_{K-1}}, \ldots, u_{p_1})$, and satisfies $p_1<p_2<\ldots<p_K$, that is, the bit sequence $u_P$ up of the retransmission information is determined according to K retransmission information bits that are determined according to an order reverse to a preset order from the bit sequence $u_A$ of the first transmission information. Because bits have different reliability in polar code encoding, in this case, as a receive end determines the K retransmission information bits according to the order reverse to the preset order during decoding, positions of bits having different reliability in first transmission can be changed in retransmission, thereby improving link performance in a transmission process.

Optionally, in S301, the bit sequence $u_P$ of the retransmission information may satisfy the following conditions:

(1) $u_P^*=(u_{p_1}, u_{p_2}, \ldots, u_{p_K})$ represents K retransmission information bits determined according to the preset order from $u_A=(u_{a_1}, u_{a_2}, \ldots, u_{a_K})$, where $p_1<p_2<\ldots<p_K$, and retransmission information bits included in $u_P$ are the same as those in $u_P^*$.

(2) $u_P$ includes I sequentially arranged groups, where $1 \leq I \leq K$. Retransmission information bits included in each of the I groups are arranged according to the preset order or arranged according to the order reverse to the preset order.

In condition (1), the K retransmission information bits are determined according to the preset order. Specifically, the arrangement order of the K retransmission information bits is the same as that of the K retransmission information bits in the bit sequence $u_A$ of the first transmission information. For example, in this embodiment, when $a_1<a_2<\ldots<a_N$, $u_P^*=(u_{p_1}, u_{p_2}, \ldots, u_{p_K})$ arranged according to the preset order satisfies $p_1<p_2<\ldots<p_K$.

For condition (1), an extreme case is K=N, that is, a quantity of the retransmission information is the same as a quantity of the first transmission information bits.

In condition (2), $u_P$ includes I groups. An $i^{th}$ group includes $K_1$ retransmission information bits, $1 \leq i \leq I$, and $K=\Sigma K_1$ is satisfied.

For example, when I=K/2, and $K_i=2$, $u_P=(u_{p_2}, u_{p_1}, u_{p_4}, u_{p_3}, \ldots, u_{p_K}, u_{p_{K-1}})$, that is, two retransmission information bits in each of sequentially arranged. K/2 groups in $u_P$ are arranged according to the order reverse to the preset order, as shown in FIG. 4A.

When I=K/3, and $K_i=3$, $u_P=(u_{p_3}, u_{p_2}, u_{p_1}, u_{p_4}, u_{p_5}, u_{p_6}, \ldots, u_{p_K}, u_{p_{K-1}}, u_{p_{K-2}})$, that is, each of sequentially arranged K/3 groups in $U_P$ includes three retransmission information bits, and as shown in FIG. 4B, retransmission information bits in the first group and in the $(K/3)^{th}$ group are arranged according to the order reverse to the preset order, and retransmission information bits in the second group are arranged according to the preset order.

It should be noted that quantities of retransmission information bits included in all groups of the I groups in the bit sequence $u_P$ of the retransmission information may be the same or may be different, and may be set flexibly by a person skilled in the art according to a specific application scenario. This is not described herein.

In this embodiment, the foregoing mathematical expressions are used merely for ease of description, and should not be construed as a limitation to the protection scope of the present invention.

In S302, polar code encoding is performed on the bit sequence $u_P$ of the retransmission information, to obtain an encoded output sequence, that is, an encoded retransmission bit sequence $y_P=(y_{p_1}, y_{p_2}, \ldots, y_{p_S})$, where S is a code length of an encoded polar code. The polar code encoding may be performed on $u_P$ by using any existing technical solution, or by using a solution obtained by improving the prior art. This is not limited in the present invention.

Figure 5:
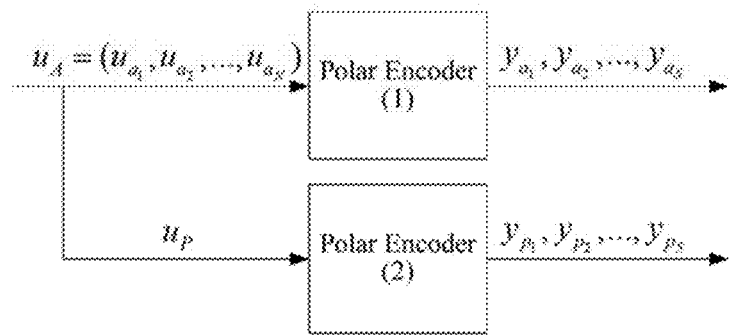
FIG. 5 is a flowchart of another polar code hybrid automatic repeat request method according to an embodiment of the present invention.

It should be noted that in a specific implementation process, a manner of obtaining the bit sequence $u_P$ of the retransmission information in S301 is not limited in the present invention. A general implementation manner in the present invention is shown in FIG. 5. A person skilled in the art may perform polar code encoding on $u_P$ by using an encoder that is different from that used when performing polar code encoding on $u_A$, or may use a same encoder according to a need of a specific implementation manner. FIG. 5 is merely an example, and the implementation manner is not limited in the present invention.

For ease of implementing the present invention, the present invention further discloses multiple manners of obtaining the bit sequence $u_P$ of the retransmission information in S301, and each of the following described implementation manners may be combined with S301.

Figure 6:
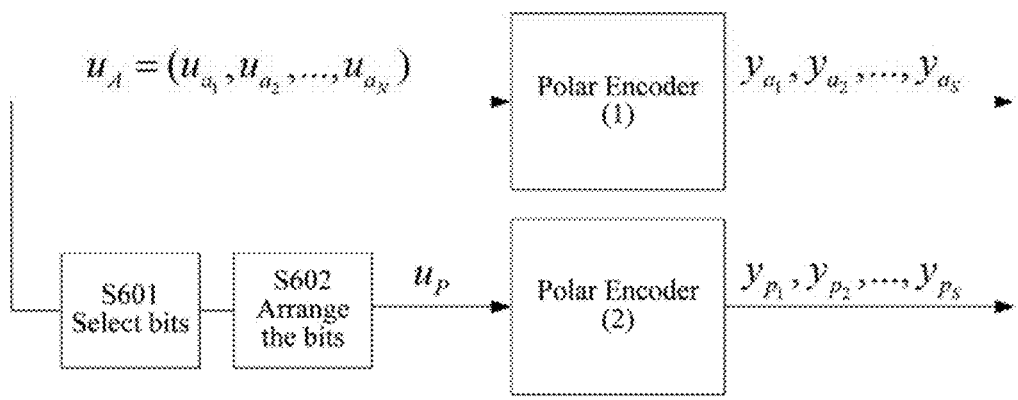
FIG. 6 is a flowchart of another polar code hybrid automatic repeat request method according to an embodiment of the present invention.

For example, an implementation manner of obtaining a bit sequence of retransmission information is shown in FIG. 6, and the obtaining the bit sequence $u_P$ of the retransmission information specifically includes the following steps:

S601. Determine K retransmission information bits, that is, select bits. Specifically, the K retransmission information bits are selected from the N first transmission information bits included in the bit sequence of the first transmission information.

S602. Determine an arrangement order of the K retransmission information bits, that is, arrange the bits. Specifically, the K retransmission information bits selected in S601 are arranged, to obtain the bit sequence $u_P$ of the retransmission information.

For example, another implementation manner of obtaining the bit sequence $u_P$ of the retransmission information specifically includes the following steps:

S701. Receive a retransmission parameter.

S702. Obtain the bit sequence of the retransmission information according to the retransmission parameter.

Figure 7A:
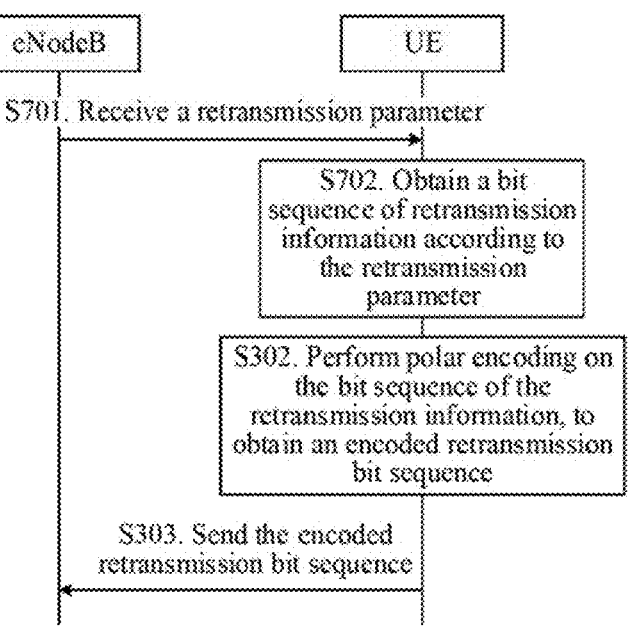
FIG. 7A is a flowchart of another polar code hybrid automatic repeat request method according to an embodiment of the present invention.
Figure 7B:
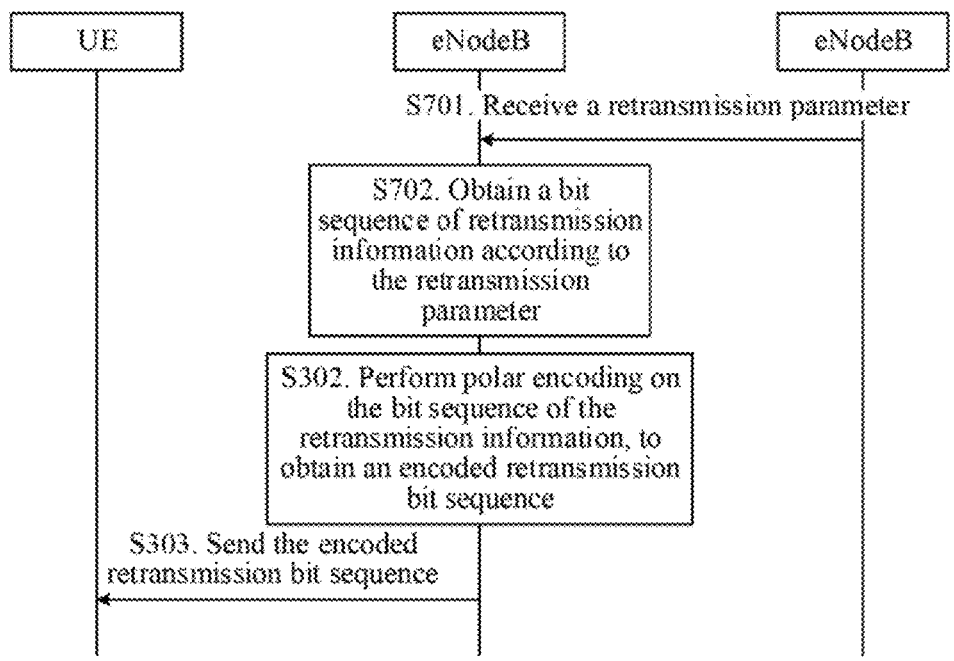
FIG. 7B is a flowchart of another polar code hybrid automatic repeat request method according to an embodiment of the present invention.

In S701, the retransmission parameter may be sent from a peer network device in a communication process, or may be sent from a control device in a communications network, a forwarder or a server having a similar control function, or the like, as shown in FIG. 7A and FIG. 7B. Names of network devices in FIG. 7A and FIG. 7B are merely used as examples.

Optionally, the retransmission parameter received in S701 may include information adequate for determining the bit sequence of the retransmission information. That is, in S702, the bit sequence of the retransmission information may be obtained according to the information carried in the retransmission parameter. For example, the retransmission parameter may include a rule for determining the K retransmission information bits, and an arrangement manner of the K retransmission information bits, so as to determine the bit sequence of the retransmission information.

Optionally, the retransmission parameter received in S701 may include only a part of information for determining the bit sequence of the retransmission information. In S702, the bit sequence of the retransmission information may be obtained according to the retransmission parameter and pre-stored information. The pre-stored information includes at least one of a rule for determining the retransmission information bits or a rule for arranging the retransmission information bits. Specific content of the retransmission parameter and the pre-stored information may be flexibly configured by a person skilled in the art in a specific implementation manner. For example, the retransmission parameter may include a rule for determining the K retransmission information bits, and the pre-stored information includes a rule for arranging the K retransmission information bits. Alternatively, the retransmission parameter may include an arrangement manner of the K retransmission information bits, and the pre-stored information includes a rule for determining the K retransmission information bits. The foregoing examples and various information combination manners derived from the examples are all within the protection scope of the present invention.

In addition, in order to save transmission resources of an air interface, the retransmission parameter may indicate, by using a number, an index, or the like, information carried in the retransmission parameter. In S702, the bit sequence of the retransmission information is determined according to the information provided by the received retransmission parameter and the pre-stored information. For example, in this scenario, the pre-stored information may include a rule for determining the retransmission information bits and a rule for arranging the retransmission information bits.

For example, the present invention further discloses an implementation manner of obtaining the bit sequence of the retransmission information, that is, obtaining the bit sequence of the retransmission information according to pre-stored information. Specifically, after first transmission, the bit sequence of the retransmission information is determined according to the bit sequence of the first transmission information and the pre-stored information by means of table lookup, calculation, or another similar processing process. The pre-stored information includes a rule for determining the retransmission information bits and a rule for arranging the retransmission information bits. This implementation manner does not need to depend on a received retransmission parameter, thereby further saving the transmission, resources of the air interface.

It should be noted that the pre-stored information disclosed in the foregoing embodiments may be in different forms in specific implementation processes. Examples are provided as follows:

The pre-stored information may be a pre-stored table, and the bit sequence of the retransmission information is determined by looking up the table directly. For example, after the first transmission, the bit sequence of the retransmission information is determined according to the preset table.

Alternatively, the pre-stored information may be a pre-stored algorithm, and the bit sequence of the retransmission information is determined by means of calculation. For example, the retransmission parameter carries a particular number, and the particular number represents a corresponding particular algorithm. After the retransmission, parameter is received, the bit sequence of the retransmission information may be determined according to the particular algorithm.

Alternatively, the pre-stored information may be in another form, such as an interleaver designed according to a table or an algorithm.

In addition, it should be noted that the rule for determining the K retransmission information bits that is disclosed in the foregoing embodiments may be in different forms in specific implementation processes. Examples are provided as follows:

For example, the K retransmission information bits may be K bits having lowest reliability among the N first transmission information bits. Because a transmission error probability of the K bits having lowest reliability is relatively high, retransmitting the K bits may greatly improve link performance.

For example, the K retransmission information bits may be selected from the N first transmission information bits according to a sequential order or according to a reverse order, or may be selected in a random manner or in a pseudo random manner. This is not limited in the present invention and is not described herein.

The present invention discloses a polar code HARQ method, which is used when multiple times of retransmission need to be performed during data transmission between network devices in a communications system, as shown in FIG. 8. For an entity for performing the method 800 shown in FIG. 8, refer to the entity for performing the method disclosed in FIG. 3. Because S301 to S303 have been described in the foregoing embodiments, only the remaining steps are described below:

S804. Obtain a bit sequence of second-time-retransmission information, where the bit sequence of the second-time-retransmission information is determined according to M second-time-retransmission information bits that are determined from the bit sequence of the first transmission information, and M is a positive integer not greater than N.

S805. Perform polar code encoding on the bit sequence of the second-time-retransmission information, to obtain an encoded second-time-retransmission bit sequence.

S806. Send the encoded second-time-retransmission bit sequence.

An execution process of S804 is similar to that of S301. It is assumed that the bit sequence $u_M$ of the second-time-retransmission information includes the M second-time-retransmission information bits, where $1 \leq M \leq N$.

The bit sequence of the second-time-retransmission information may be obtained in any one or a combination of the manners described in the foregoing embodiments. In addition, a method of obtaining the bit sequence of the retransmission information may be the same or different from that of obtaining the bit sequence of the second-time-retransmission information.

Optionally, the M second-time-retransmission information bits included in the bit sequence of the second-time-retransmission information may be different from the K retransmission information bits included in the bit sequence of the retransmission information. In this case, K+M bits are retransmitted, thereby further improving link performance.

Further optionally, when the K retransmission information bits are the K bits having lowest reliability among the N first transmission information bits, the M second-time-retransmission information bits may be the $(K+1)^{th}$ to the $(K+M)^{th}$ bits having lowest reliability among the N first transmission information bits.

In S805, polar code encoding is performed on $u_M$, to obtain an encoded output sequence, that is, an encoded second-time-retransmission bit sequence $y_M=(y_{m_1}, y_{m_2}, \ldots , y_{m_S})$. It should be noted that, during the first transmission and one or more times of retransmission, a same polar code encoding solution may be used, or different polar code encoding solutions may be used.

Figure 9:
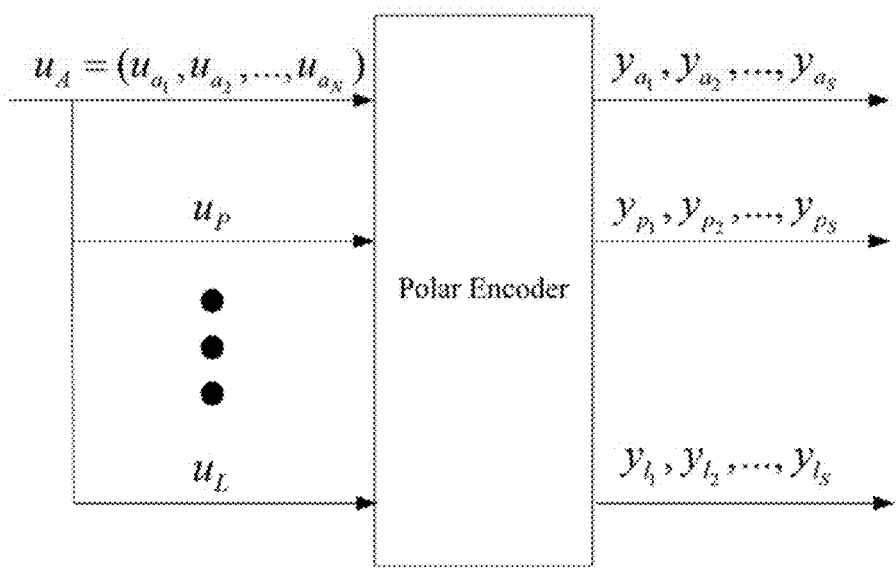
FIG. 9 is a flowchart of another polar code hybrid automatic repeat request method according to an embodiment of the present invention.

FIG. 9 shows a polar code HARQ method in a process in which multiple times of retransmission are performed. In first transmission and each retransmission, process, a same polar code encoder and a same polar code encoding solution may be used, or different polar code encoders and different polar code encoding solutions may be used, or similar configuration solutions may be used. For a retransmission process from the second time of retransmission, refer to the solution disclosed in S804 to S806, which is not described herein again.

Figure 10:
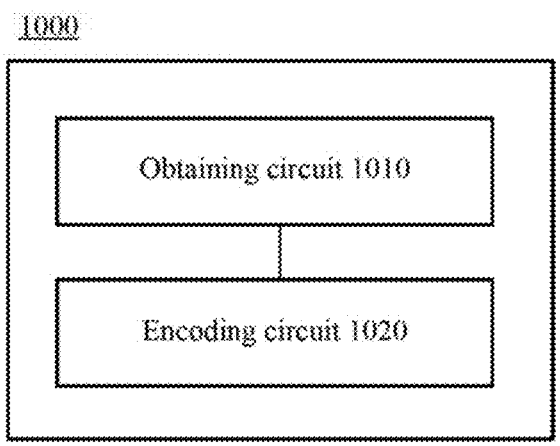
FIG. 10 is a schematic diagram of a polar code encoding apparatus according to an embodiment of the present invention.

FIG. 10 is a schematic diagram of a polar code encoding apparatus disclosed in the present invention. The apparatus 1000 shown in FIG. 10 includes an obtaining circuit 1010 and an encoding circuit 1020. Specifically:

The obtaining circuit 1010 is configured to obtain a bit sequence of retransmission information, where the bit sequence of the retransmission information includes K retransmission information bits determined from a bit sequence of first transmission information, the bit sequence of the first transmission information includes N first transmission information bits, N is a positive integer, and K is a positive integer not greater than N.

The encoding circuit 1020 is configured to perform polar code encoding on the bit sequence of the retransmission information that is obtained by the obtaining circuit 1010, to obtain an encoded retransmission bit sequence.

It should be understood that, in a specific application, the encoding apparatus 1000 may be located in network devices in various forms, such as a macro base station, a micro base station, a repeater, or user equipment, so as to implement an operation of encoding the bit sequence of the retransmission information. The encoding apparatus 1000 may be a general-purpose processor, including a central processing unit (CPU), a network processor (NP), and the like, or may be a digital signal processor (DSP), an application-specific integrated circuit (ASIC), a field-programmable gate array (FPGA), or another programmable logic device, discrete gate, transistor logic device, or discrete hardware component. The obtaining circuit 1010 and the encoding circuit 1020 may be independent from each other and exist separately, or may be integrated together as junction components to form a larger sized circuit. Steps of the methods disclosed in the embodiments of the present invention may be directly performed by a hardware encoding processor, or may be performed by using a combination of hardware and software modules in the encoding processor. The software module may be located in a storage medium such as a random access memory, a flash memory, a read-only memory, a programmable read-only memory, an electrically erasable programmable memory, or a register.

The obtaining circuit 1010 may be configured to perform the method described in S301. Refer to the foregoing descriptions for details, which are not described herein again.

Figure 11A:
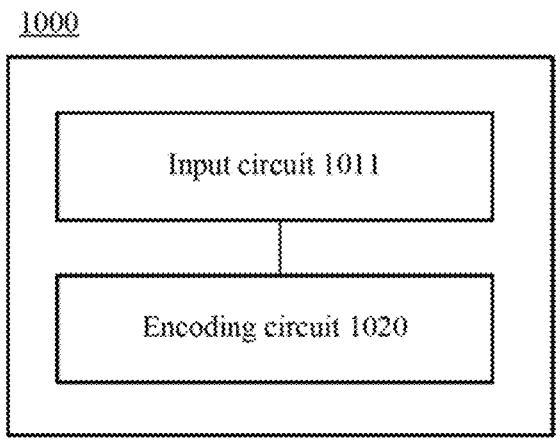
FIG. 11A is a schematic diagram of another polar code encoding apparatus according to an embodiment of the present invention.

Alternatively, the obtaining circuit 1010 may be specifically an input circuit 1011, as shown in FIG. 11A. Specifically, the input circuit 1011 is used as an input end of the encoding apparatus 1000, and is specifically configured to input the bit sequence of the retransmission information. Input information obtained by the input circuit 1011, that is, the bit sequence of the retransmission information, may be determined by another apparatus.

Figure 11B:
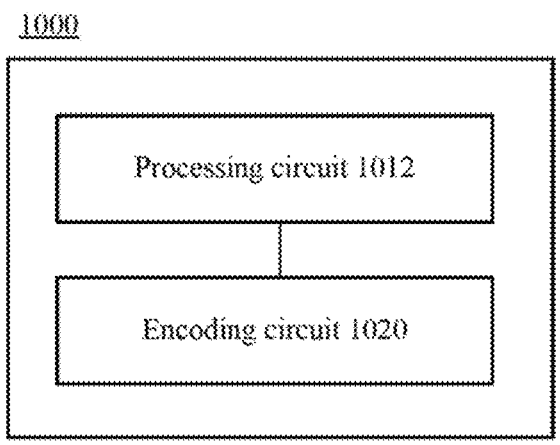
FIG. 11B is a schematic diagram of another polar code encoding apparatus according to an embodiment of the present invention.

Alternatively, the obtaining circuit 1010 may be specifically a processing circuit 1012, as shown in FIG. 11B. Specifically, the processing circuit 1012 is configured to determine the bit sequence of the retransmission information.

For example, the processing circuit 1012 determines the bit sequence of the retransmission information by performing processing such as bit selection and bit arrangement on the bit sequence of the first transmission information. The processing circuit 1012 may be configured to perform the method described in S601 and S602. Refer to the foregoing descriptions for details, which are not described herein again.

For example, the processing circuit 1012 obtains the bit sequence of the retransmission information according to pre-stored information. Specifically, after first transmission, the bit sequence of the retransmission information is determined according to the bit sequence of the first transmission information and the pre-stored information by means of table lookup, calculation, or another similar processing process. The pre-stored information includes a rule for determining the retransmission information bits and a rule for arranging the retransmission information bits.

The encoding circuit 1020 may be a general-purpose or special-purpose circuit, an encoder, or another circuit having an encoding function, and is configured to perform polar code encoding on the bit sequence of the retransmission information. The polar code encoding may be performed by using any existing technical solution, or by using a solution obtained by improving the prior art. This is not limited in the present invention. The encoding circuit 1020 may be configured to perform the method described in S302. Refer to the foregoing descriptions for details, which are not described herein again.

Figure 12:
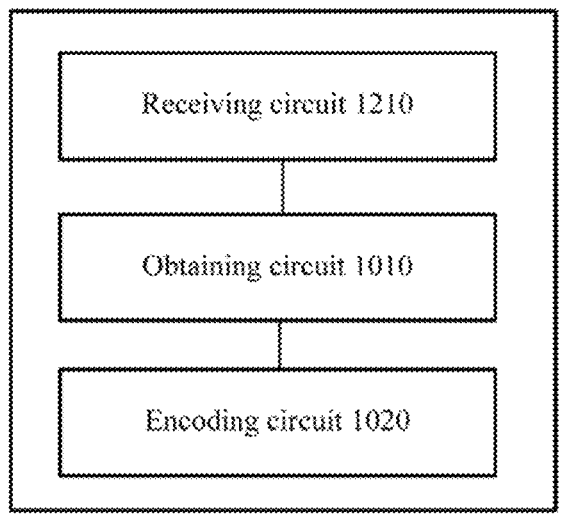
FIG. 12 is a schematic diagram of a communications apparatus according to an embodiment of the present invention.

FIG. 12 is a schematic diagram of a polar code communications apparatus disclosed in the present invention. The communications apparatus 1200 shown in FIG. 12 includes a receiving circuit 1210 and the polar code encoding apparatus 1000, Specifically:

The receiving circuit 1210 is configured to receive a retransmission parameter.

The obtaining circuit 1010 included in the polar code encoding apparatus 1000 is further configured to obtain the bit sequence of the retransmission information according to the retransmission parameter received by the receiving circuit 1210.

The receiving circuit 1210 and the obtaining circuit 1010 may be configured to perform the method described in S701 and S702. Refer to the foregoing descriptions for details, which are not described herein again.

The receiving circuit 1210 may be a receiver, or a transceiver into which a transmitting circuit is integrated, or the like.

Figure 13:
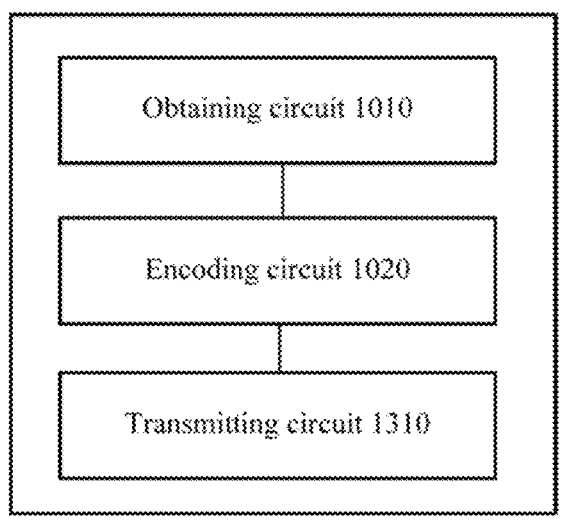
FIG. 13 is a schematic diagram of another communications apparatus according to an embodiment of the present invention.

FIG. 13 is a schematic diagram of a polar code communications apparatus disclosed in the present invention. The communications apparatus 1300 shown in FIG. 13 includes the polar code encoding apparatus 1000 and a transmitting circuit 1310. Specifically:

The transmitting circuit 1310 is configured to send the encoded retransmission bit sequence to another communications apparatus. The encoded retransmission bit sequence is determined by the polar code encoding apparatus 1000.

The transmitting circuit 1310 may be configured to perform the method described in S301. Refer to the foregoing descriptions for details, which are not described herein again.

The transmitting circuit 1310 may be a transmitter, or a transceiver into which a receiving circuit is integrated, or the like.

Figure 14:
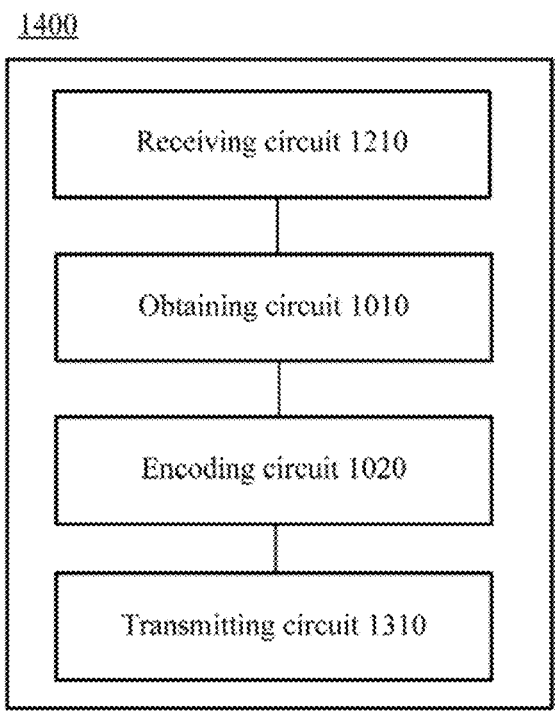
FIG. 14 is a schematic diagram of another communications apparatus according to an embodiment of the present invention.

FIG. 14 is a schematic diagram of a polar code communications apparatus disclosed in the present invention. The communications apparatus 1400 shown in FIG. 14 includes the receiving circuit 1210, the polar code encoding apparatus 1000 and the transmitting circuit 1310.

The communications apparatus 1400 may be configured to perform the methods described in FIG. 3 and FIG. 5 to FIG. 8. Refer to the foregoing descriptions for details, which are not described herein again.

Based on the foregoing descriptions of the embodiments, a person skilled in the art may clearly understand that the present invention may be implemented by software in addition to necessary general hardware. Based on the understanding, all or a part of the steps of the technical solutions of the present invention may be implemented by a program instructing relevant hardware. The program may be stored in a computer readable storage medium. When the program is run, the steps of the method according to the foregoing embodiments are performed.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A polar code hybrid automatic repeat request method comprising:
   obtaining, by a communications device, a bit sequence of retransmission information, wherein the bit sequence of the retransmission information comprises K retransmission information bits determined from a bit sequence of first transmission information, the bit sequence of the first transmission information comprises N first transmission information bits, N is a positive integer, and K is a positive integer not greater than N;
   performing, by the communications device, polar code encoding on the bit sequence of the retransmission information, to obtain an encoded retransmission bit sequence; and
   sending, by the communications device, the encoded retransmission bit sequence to another communications device.

2. The method according to claim 1, wherein the K retransmission information bits in the bit sequence of the retransmission information are arranged according to a preset order, and the preset order is the same as an arrangement order of the N bits in the bit sequence of the first transmission information.

3. The method according to claim 1, wherein the K retransmission information bits in the bit sequence of the retransmission information are arranged according to an order reverse to a preset order, and the preset order is the same as an arrangement order of the N bits in the bit sequence of the first transmission information.

4. The method according to claim 1, wherein the bit sequence of the retransmission information comprises I sequentially arranged groups, wherein retransmission information bits comprised in each of the I groups are arranged according to a preset order or arranged according to an order reverse to the preset order, the preset order is the same as an arrangement order of the N bits in the bit sequence of the first transmission information, and I is a positive integer not greater than K.

5. The method according to claim 1, wherein the method further comprises:
   receiving a retransmission parameter; and
   the obtaining a bit sequence of the retransmission information is:
   obtaining the bit sequence of the retransmission information according to the retransmission parameter.

6. The method according to claim 5, wherein the obtaining a bit sequence of the retransmission information according to the retransmission parameter is:
   obtaining the bit sequence of the retransmission information according to the retransmission parameter and pre-stored information, wherein the pre-stored information comprises at least one of a rule for determining the retransmission information bits or a rule for arranging the retransmission information bits.

7. The method according to claim 1, wherein the obtaining a bit sequence of the retransmission information is:

obtaining the bit sequence of the retransmission information according to pre-stored information, wherein the pre-stored information comprises a rule for determining the retransmission information bits and a rule for arranging the retransmission information bits.

8. The method according to claim 1, wherein the K retransmission information bits are K bits having lowest reliability among the N first transmission information bits.

9. A polar code encoding apparatus comprising:
an obtaining circuit, configured to obtain a bit sequence of retransmission information, wherein the bit sequence of the retransmission information comprises K retransmission information bits determined from a bit sequence of first transmission information, the bit sequence of the first transmission information comprises N first transmission information bits, N is a positive integer, and K is a positive integer not greater than N; and
an encoding circuit, in communication with the obtaining circuit and configured to perform polar code encoding on the bit sequence of the retransmission information that is obtained by the obtaining circuit, to obtain an encoded retransmission bit sequence.

10. The apparatus according to claim 9, wherein the K retransmission information bits in the bit sequence of the retransmission information are arranged according to a preset order, and the preset order is the same as an arrangement order of the N bits in the bit sequence of the first transmission information.

11. The apparatus according to claim 9, wherein the K retransmission information bits in the bit sequence of the retransmission information are arranged according to an order reverse to a preset order, and the preset order is the same as an arrangement order of the N bits in the bit sequence of the first transmission information.

12. The apparatus according to claim 9, wherein the bit sequence of the retransmission information comprises I sequentially arranged groups, wherein retransmission information bits comprised in each of the I groups are arranged according to a preset order or arranged according to an order reverse to the preset order, the preset order is the same as an arrangement order of the N bits in the bit sequence of the first transmission information, and I is a positive integer not greater than K.

13. The apparatus according to claim 9, wherein the K retransmission information bits are K bits having lowest reliability among the N first transmission information bits.

14. The apparatus according to claim 9, wherein the obtaining circuit is further configured to:
obtain the bit sequence of the retransmission information according to pre-stored information, wherein the pre-stored information comprises a rule for determining the retransmission information bits and a rule for arranging the retransmission information bits.

15. A communications apparatus comprising:
a receiving circuit, configured to receive a retransmission parameter; and
an obtaining circuit, in communication with the receiving circuit and configured to obtain a bit sequence of retransmission information according to the retransmission parameter received by the receiving circuit, wherein the bit sequence of the retransmission information comprises K retransmission information bits determined from a bit sequence of first transmission information, the bit sequence of the first transmission information comprises N first transmission information bits, N is a positive integer, and K is a positive integer not greater than N; and
an encoding circuit, configured to perform polar code encoding on the bit sequence of the retransmission information that is obtained by the obtaining circuit, to obtain an encoded retransmission bit sequence.

16. The apparatus according to claim 15, wherein the K retransmission information bits in the bit sequence of the retransmission information are arranged according to a preset order, and the preset order is the same as an arrangement order of the N bits in the bit sequence of the first transmission information.

17. The apparatus according to claim 15, wherein the K retransmission information bits in the bit sequence of the retransmission information are arranged according to an order reverse to a preset order, and the preset order is the same as an arrangement order of the N bits in the bit sequence of the first transmission information.

18. The apparatus according to claim 15, wherein the bit sequence of the retransmission information comprises I sequentially arranged groups, wherein retransmission information bits comprised in each of the I groups are arranged according to a preset order or arranged according to an order reverse to the preset order, the preset order is the same as an arrangement order of the N bits in the bit sequence of the first transmission information, and I is a positive integer not greater than K.

19. The apparatus according to claim 15, wherein the K retransmission information bits are K bits having lowest reliability among the N first transmission information bits.

20. The apparatus according to claim 15, wherein the obtaining circuit is further configured to:
obtain the bit sequence of the retransmission information according to pre-stored information, wherein the pre-stored information comprises a rule for determining the retransmission information bits and a rule for arranging the retransmission information bits.

21. The apparatus according to claim 15, wherein the obtaining circuit is further configured to:
obtain the bit sequence of the retransmission information according to the retransmission parameter and pre-stored information, wherein the pre-stored information comprises at least one of a rule for determining the retransmission information bits or a rule for arranging the retransmission information bits.

22. The apparatus according to claim 15, wherein the apparatus further comprises:
a transmitting circuit, configured to send the encoded retransmission bit sequence to another communications apparatus.

* * * * *